United States Patent
Feng et al.

(10) Patent No.: US 11,348,534 B2
(45) Date of Patent: May 31, 2022

(54) SHIFT REGISTER UNIT AND METHOD FOR DRIVING THE SAME, AND GATE DRIVING CIRCUIT

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Sixiang Wu, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/254,047

(22) PCT Filed: Jun. 19, 2020

(86) PCT No.: PCT/CN2020/097159
§ 371 (c)(1),
(2) Date: Dec. 18, 2020

(87) PCT Pub. No.: WO2020/253837
PCT Pub. Date: Dec. 24, 2020

(65) Prior Publication Data
US 2021/0327363 A1 Oct. 21, 2021

(30) Foreign Application Priority Data
Jun. 19, 2019 (CN) .......................... 201910534621.0

(51) Int. Cl.
*G09G 3/3266* (2016.01)
*G11C 19/28* (2006.01)

(52) U.S. Cl.
CPC .......... *G09G 3/3266* (2013.01); *G11C 19/28* (2013.01); *G09G 2310/0286* (2013.01)

(58) Field of Classification Search
CPC ............................. G09G 3/3266; G11C 19/28
(Continued)

(56) References Cited

U.S. PATENT DOCUMENTS

| 9,947,274 B2 | 4/2018 | Park et al. |
| 10,547,316 B2 | 1/2020 | Takasugi et al. |

(Continued)

FOREIGN PATENT DOCUMENTS

| CN | 101388197 A | 3/2009 |
| CN | 104464645 A | 3/2015 |

(Continued)

OTHER PUBLICATIONS

First Chinese Office Action dated May 13, 2021, received for corresponding Chinese Application No. 201910534621.0, 15 pages.

*Primary Examiner* — Prabodh M Dharia
(74) *Attorney, Agent, or Firm* — Kinney & Lange, P.A.

(57) ABSTRACT

A shift register unit and a method for driving the same, and a gate driving circuit are provided. The shift register unit includes: an adjustment circuit coupled between an input signal terminal and an input node of the shift register unit, and configured to couple or decouple the input signal terminal and the input node under control of a potential at the input signal terminal; an input circuit for providing a potential at the input node to the pull-up node under control of a potential at the input signal terminal; an output circuit for receiving a clock signal from the clock signal terminal and provide an output signal to the output signal terminal based on the received clock signal under control of a potential at the pull-up node; and a control circuit for (Continued)

controlling a potential at the output signal terminal under control of a potential at the pull-up node.

17 Claims, 9 Drawing Sheets

(58) Field of Classification Search
USPC .......................................................... 345/204
See application file for complete search history.

(56) References Cited

U.S. PATENT DOCUMENTS

| | | | |
|---|---|---|---|
| 10,657,879 B1* | 5/2020 | Gu | G09G 3/2096 |
| 10,658,061 B2* | 5/2020 | Liao | G11C 19/28 |
| 2017/0294165 A1 | 10/2017 | Park et al. | |
| 2018/0337682 A1 | 11/2018 | Takasugi et al. | |
| 2019/0272884 A1* | 9/2019 | Liao | G09G 3/20 |
| 2020/0027516 A1 | 1/2020 | Feng | |
| 2020/0160774 A1 | 5/2020 | Gu et al. | |
| 2020/0258439 A1* | 8/2020 | Li | G09G 3/20 |

FOREIGN PATENT DOCUMENTS

| | | |
|---|---|---|
| CN | 106297634 A | 1/2017 |
| CN | 107274838 A | 10/2017 |
| CN | 108877682 A | 11/2018 |
| CN | 108932930 A | 12/2018 |
| CN | 109697963 A | 4/2019 |
| CN | 109830256 A | 5/2019 |
| CN | 110148383 A | 8/2019 |
| KR | 100624320 B1 | 9/2006 |
| KR | 20190009216 A | 1/2019 |
| WO | 2011046015 A1 | 4/2011 |

\* cited by examiner

SHIFT REGISTER UNIT AND METHOD FOR DRIVING THE SAME, AND GATE DRIVING CIRCUIT

CROSS-REFERENCE TO RELATED APPLICATION(S)

This application is a Section 371 National Stage Application of International Application No. PCT/CN2020/097159, filed on Jun. 19, 2020, entitled "SHIFT REGISTER UNIT AND METHOD FOR DRIVING THE SAME, AND GATE DRIVING CIRCUIT", which in turn claims priority to Chinese Patent Application No. 201910534621.0, filed on Jun. 19, 2019, which is incorporated herein by reference in its entirety.

TECHNICAL FIELD

The present disclosure relates to a field of display technology, and in particular to a shift register unit, a method for driving the shift register unit, and a gate driving circuit.

BACKGROUND

In a display field, for example, in a gate driving circuit of an OLED display device, cascaded shift register units are usually used to generate scan signals for scanning corresponding pixel units on a display panel. In practical applications, for various reasons, a leakage current may be generated in the shift register unit, thereby affecting an output signal and further affecting a display effect.

SUMMARY

The present disclosure provides a shift register unit, a method for driving the shift register unit, and a gate driving circuit.

According to an aspect of the embodiments of the present disclosure, there is provided a shift register unit, comprising: an adjustment circuit coupled between an input signal terminal and an input node of the shift register unit, and configured to couple or decouple the input signal terminal and the input node under control of a potential at the input signal terminal; an input circuit coupled to the input signal terminal, the input node, and a pull-up node of the shift register unit, and configured to provide a potential at the input node to the pull-up node under control of a potential at the input signal terminal; an output circuit coupled to the pull-up node, a clock signal terminal of the shift register unit, and an output signal terminal of the shift register unit, and configured to receive a clock signal from the clock signal terminal and provide an output signal to the output signal terminal based on the received clock signal under control of a potential at the pull-up node; and a control circuit coupled to the pull-up node and the output signal terminal, and configured to control a potential at the output signal terminal under control of a potential at the pull-up node.

In an example, the adjustment circuit comprises a first transistor, a gate of the first transistor and a first electrode of the first transistor are coupled to the input signal terminal, and a second electrode of the first transistor is coupled to the input node.

In an example, the input circuit comprises a second transistor and a third transistor, a gate of the second transistor and a gate of the third transistor are coupled to the input signal terminal, a first electrode of the second transistor is coupled to the input node, a second electrode of the second transistor is coupled to a first electrode of the third transistor, and a second electrode of the third transistor is coupled to the pull-up node.

In an example, the shift register unit further comprises: a voltage stabilizing circuit coupled to a first power signal terminal, the pull-up node, and a voltage stabilizing node, and configured to provide a potential at the first power signal terminal to the voltage stabilizing node under control of a potential at the pull-up node; wherein the voltage stabilizing node is coupled to the second electrode of the second transistor and the first electrode of the third transistor.

In an example, the voltage stabilizing circuit comprises a fourth transistor, a gate of the fourth transistor is coupled to the pull-up node, a first electrode of the fourth transistor is coupled to the first power signal terminal, and a second electrode of the fourth transistor is coupled to the voltage stabilizing node.

In an example, the shift register unit further comprises: a sensing circuit coupled to a first control signal terminal, a second control signal terminal, the input signal terminal, and the pull-up node, and configured to store a voltage under control of a potential at the first control signal terminal and a potential at the input signal terminal, and provide a potential at the second control signal terminal to the pull-up node by using the stored voltage.

In an example, the sensing circuit comprises a fifth transistor, a sixth transistor, a seventh transistor, and a first capacitor; wherein a gate of the fifth transistor is coupled to the first control signal terminal, a first electrode of the fifth transistor is coupled to the input signal terminal, and a second electrode of the fifth transistor is coupled to a gate of the sixth transistor; the gate of the sixth transistor is coupled to the second electrode of the fifth transistor, a first electrode of the sixth transistor is coupled to the second control signal terminal, and a second electrode of the sixth transistor is coupled to a first electrode of the seventh transistor; a gate of the seventh transistor is coupled to the second control signal terminal, a first electrode of the seventh transistor is coupled to the second electrode of the sixth transistor, and a second electrode of the seventh transistor is coupled to the pull-up node; and a first electrode of the first capacitor is coupled to the gate of the sixth transistor, and a second electrode of the first capacitor is coupled to the second electrode of the sixth transistor.

In an example, the sensing circuit further comprises an eighth transistor and a ninth transistor; wherein a gate of the eighth transistor is coupled to the first control signal terminal, a first electrode of the eighth transistor is coupled to the second electrode of the fifth transistor, and a second electrode of the eighth transistor is coupled to the gate of the sixth transistor; and a gate of the ninth transistor is coupled to the gate of the sixth transistor, a first electrode of the ninth transistor is coupled to a first power signal terminal, and a second electrode of the ninth transistor is coupled to the second electrode of the fifth transistor.

In an example, the control circuit comprises: a pull-down control sub-circuit coupled to the pull-up node, a pull-down node, and a second power signal terminal, and configured to control a potential at the pull-down node under control of a potential at the pull-up node and a potential at the second power signal terminal; and a pull-down sub-circuit coupled to the output signal terminal and the pull-down node, and configured to control a potential at the output signal terminal under control of a potential at the pull-down node.

In an example, the pull-down control sub-circuit comprises a tenth transistor, an eleventh transistor, a twelfth transistor, and a thirteenth transistor; wherein a gate of the tenth transistor is coupled to the pull-up node, a first electrode of the tenth transistor is coupled to a first reference signal terminal, and a second electrode of the tenth transistor is coupled to the pull-down node; a gate of the eleventh transistor is coupled to the pull-down node, a first electrode of the eleventh transistor is coupled to a voltage stabilizing node, and a second electrode of the eleventh transistor is coupled to the pull-up node; a gate of the twelfth transistor is coupled to the pull-down node, a first electrode of the twelfth transistor is coupled to the first reference signal terminal, and a second electrode of the twelfth transistor is coupled to the voltage stabilizing node; and a gate of the thirteenth transistor and a first electrode of the thirteenth transistor are coupled to the second power signal terminal, and a second electrode of the thirteenth transistor is coupled to the pull-down node.

In an example, the output signal terminals comprises a control output signal terminal and a first output signal terminal, and the pull-down sub-circuit comprises a fourteenth transistor and a fifteenth transistor; wherein a gate of the fourteenth transistor is coupled to the pull-down node, a first electrode of the fourteenth transistor is coupled to a first reference signal terminal, and a second electrode of the fourteenth transistor is coupled to the control output signal terminal; and a gate of the fifteenth transistor is coupled to the pull-down node, a first electrode of the fifteenth transistor is coupled to a second reference signal terminal, and a second electrode of the fifteenth transistor is coupled to the first output signal terminal.

In an example, the shift register unit further comprises a reset circuit, and the reset circuit comprises: a first reset sub-circuit coupled to a first reset signal terminal and the pull-up node, and configured to reset the pull-up node under control of a potential at the first reset signal terminal; and a second reset sub-circuit coupled to a second reset signal terminal and the pull-up node, and configured to reset the pull-up node under control of a potential at the second reset signal terminal.

In an example, the first reset sub-circuit comprises a sixteenth transistor and a seventeenth transistor, a gate of the sixteenth transistor is coupled to the first reset signal terminal, a first electrode of the sixteenth transistor is coupled to a first reference signal terminal, and a second electrode of the sixteenth transistor is coupled to a voltage stabilizing node, and a gate of the seventeenth transistor is coupled to the first reset signal terminal, a first electrode of the seventeenth transistor is coupled to the voltage stabilizing node, and a second electrode of the seventeenth transistor is coupled to the pull-up node; and the second reset sub-circuit comprises an eighteenth transistor and a nineteenth transistor, a gate of the eighteenth transistor is coupled to the second reset signal terminal, a first electrode of the eighteenth transistor is coupled to the voltage stabilizing node, and a second electrode of the eighteenth transistor is coupled to the pull-up node, and a gate of the nineteenth transistor is coupled to the second reset signal terminal, a first electrode of the nineteenth transistor is coupled to the first reference signal terminal, and a second electrode of the nineteenth transistor is coupled to the voltage stabilizing node.

In an example, the clock signal terminals comprises a first clock signal terminal and a second clock signal terminal, and the output circuit comprises: a control output sub-circuit comprising a twentieth transistor and a second capacitor, wherein a gate of the twentieth transistor is coupled to the pull-up node, a first electrode of the twentieth transistor is coupled to the first clock signal terminal, a second electrode of the twentieth transistor is coupled to the control output signal terminal, a first electrode of the second capacitor is coupled to the gate of the twentieth transistor, and a second electrode of the second capacitor is coupled to the second electrode of the twentieth transistor; and a first output sub-circuit comprising a twenty-first transistor, wherein a gate of the twenty-first transistor is coupled to the pull-up node, a first electrode of the twenty-first transistor is coupled to the second clock signal terminal, and a second electrode of the twenty-first transistor is coupled to the first output signal terminal.

In an example, the clock signal terminals further comprises a third clock signal terminal, and the output signal terminals further comprises a second output signal terminal; and wherein the output circuit further comprises a second output sub-circuit, and the second output sub-circuit comprises a twenty-second transistor, a gate of the twenty-second transistor is coupled to the pull-up node, a first electrode of the twenty-second transistor is coupled to the third clock signal terminal, and a second electrode of the twenty-second transistor is coupled to the second output signal terminal; and the pull-down sub-circuit further comprises a twenty-third transistor, a gate of the twenty-third transistor is coupled to the pull-down node, a first electrode of the twenty-third transistor is coupled to the second reference signal terminal, and a second electrode of the twenty-third transistor is coupled to the second output signal terminal.

In an example, the shift register unit further comprises a twenty-fourth transistor, a gate of the twenty-fourth transistor is coupled to the input signal terminal, a first electrode of the twenty-fourth transistor is coupled to a first reference signal terminal, and a second electrode of the twenty-fourth transistor is coupled to a pull-down node.

According to an aspect of the embodiments of the present disclosure, there is provided a gate driving circuit comprising N stages of cascaded shift register units, the shift register units comprising the shift register unit described above, wherein N is an integer greater than 1.

According to an aspect of the embodiments of the present disclosure, there is provided a method for driving the shift register unit described above, comprising that: in first period, an input signal being at a first level is applied to an input signal terminal, an adjustment circuit couples the input signal terminal to an input node to provide the input signal being at the first level to the input node, and an input circuit provides the input signal being at the first level at the input node to a pull-up node; in second period, the input signal is at a second level, the adjustment circuit decouples the input signal terminal and the input node, and a potential at the pull-up node causes an output circuit to provide a clock signal from the clock signal terminal to an output signal terminal; and in third period, a reset signal being at a first level is applied to a reset signal terminal of the shift register unit to reset the pull-up node, and a potential at the pull-up node causes a control circuit to pull down the output signal terminal to be at a second level.

DETAILED DESCRIPTION OF EMBODIMENTS

Figure 1:
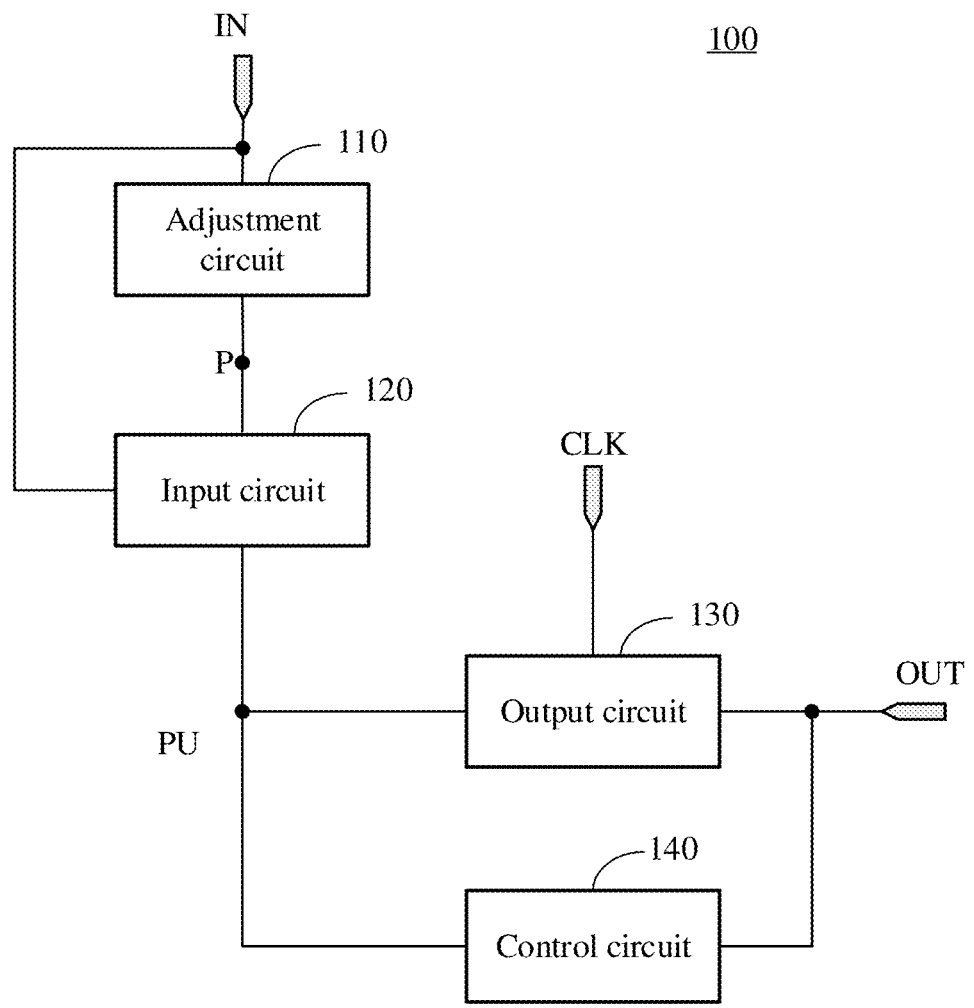
FIG. 1 shows a schematic block diagram of a shift register unit according to an embodiment of the present disclosure.

In order to make the objectives, technical solutions and advantages of the embodiments of the present disclosure clearer, the technical solutions in the embodiments of the present disclosure will be described clearly and completely in conjunction with the accompanying drawings in the embodiments of the present disclosure. Obviously, the described embodiments are part of the embodiments of the present disclosure, but not all of them. Based on the described embodiments of the present disclosure, all other embodiments obtained by those of ordinary skill in the art without creative labor are within the protection scope of the present disclosure. It should be noted that throughout the drawings, the same elements are represented by the same or similar reference signs. In the following description, some specific embodiments are only used for descriptive purposes, and should not be construed as limiting the present disclosure, but are merely examples of the embodiments of the present disclosure. When it may cause confusion in the understanding of the present disclosure, conventional structures or configurations will be omitted. It should be noted that the shape and size of each component in the figure do not reflect the actual size and ratio, but merely illustrate the content of the embodiment of the present disclosure.

Unless otherwise defined, the technical or scientific terms used in the embodiments of the present disclosure should have the usual meanings understood by those skilled in the art. The "first", "second" and similar words used in the embodiments of the present disclosure do not indicate any order, quantity, or importance, but are only used to distinguish different components.

In addition, in the description of the embodiments of the present disclosure, the term "connected" or "connected to" may mean that two components are directly connected, or that two components are connected via one or more other components. In addition, these two components may be connected or coupled by wired or wireless means.

In addition, in the description of the embodiments of the present disclosure, the terms "first level" and "second level" are only used to distinguish the two levels from being different in amplitude. For example, in the following description, the "first level" is a low level and the "second level" is a high level as an example. Those skilled in the art may understand that the present disclosure is not limited thereto.

The transistors used in the embodiments of the present disclosure may all be thin film transistors or field effect transistors or other devices with the same characteristics. Preferably, the thin film transistor used in the embodiments of the present disclosure may be an oxide semiconductor transistor. Since a source and a drain of the thin film transistor used here are symmetrical, the source and the drain may be interchanged. In the embodiments of the present disclosure, one of the source and the drain is called a first electrode, and the other of the source and the drain is called a second electrode. In the following examples, an N-type thin film transistor is taken as an example for description. Those skilled in the art may understand that the embodiments of the present disclosure may obviously be applied to a case of P-type thin film transistors.

FIG. 1 shows a schematic block diagram of a shift register unit 100 according to an embodiment of the present disclosure. As shown in FIG. 1, the shift register unit 100 includes an adjustment circuit 110, an input circuit 120, an output circuit 130, and a control circuit 140.

The adjustment circuit 110 is coupled between an input signal terminal IN and an input node P of the shift register unit 100. The adjustment circuit 110 may couple or decouple the input signal terminal IN and the input node P under control of a potential at the input signal terminal IN.

The input circuit 120 is coupled to the input signal terminal IN, the input node P, and a pull-up node PU of the shift register unit 100. The input circuit 120 may provide a potential at the input node P to the pull-up node PU under control of a potential at the input signal terminal IN.

The output circuit 130 is coupled to the pull-up node PU, a clock signal terminal CLK, and an output signal terminal OUT of the shift register unit 100. The output circuit 130 may receive a clock signal from the clock signal terminal CLK and provide an output signal to the output signal terminal OUT based on the received clock signal under control of a potential at the pull-up node PU.

The control circuit 140 is coupled to the pull-up node PU and the output signal terminal OUT. The control circuit 140 may control a potential at the output signal terminal OUT under control of a potential at the pull-up node PU.

The embodiment of the present disclosure may prevent leakage current from being generated at the input signal terminal by providing an adjustment circuit in the shift register unit, which may be further described in detail below with an example.

Figure 2:
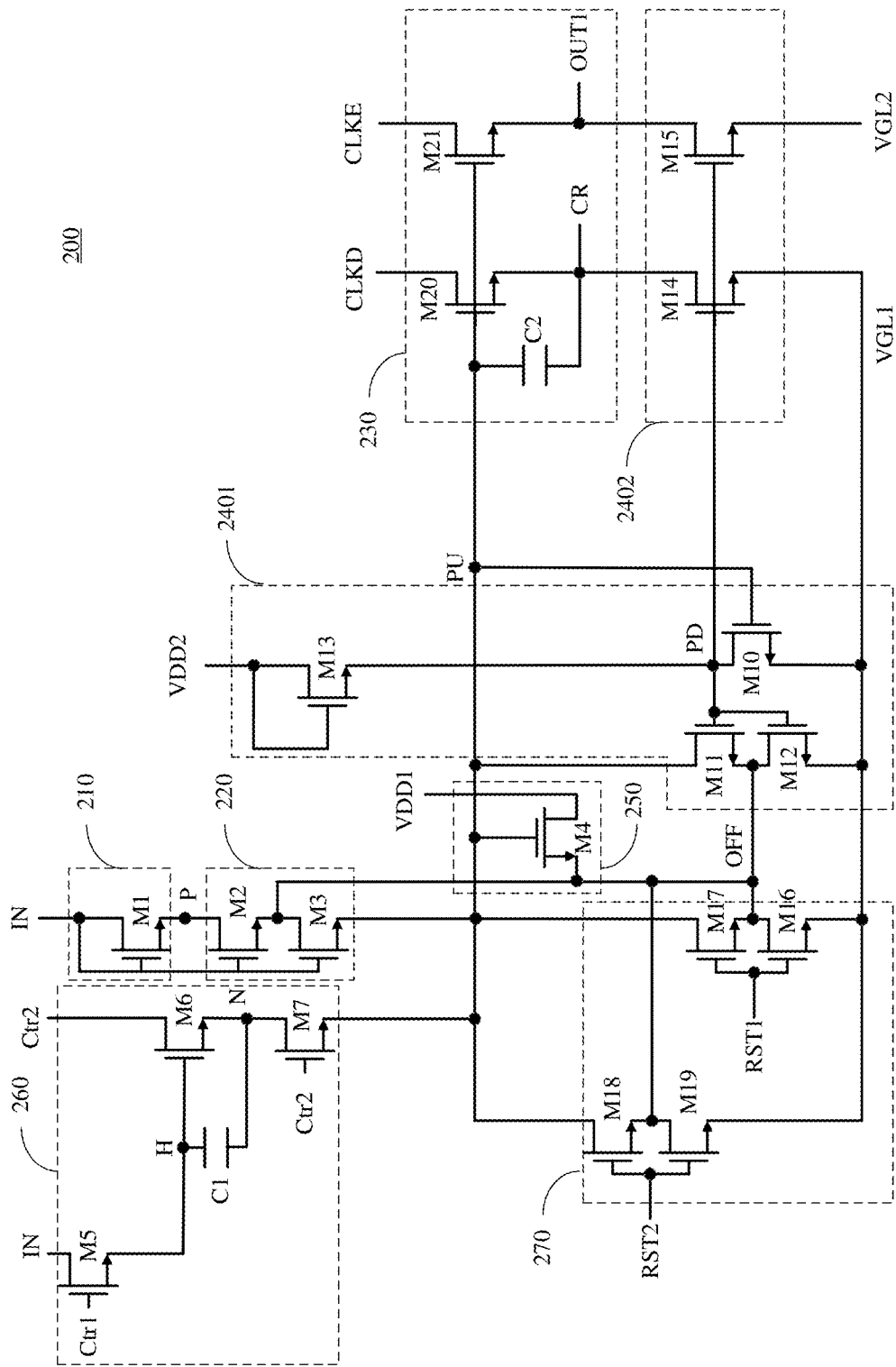
FIG. 2 shows a circuit diagram of a shift register unit according to an embodiment of the present disclosure.

FIG. 2 shows a circuit diagram of a shift register unit 200 according to an embodiment of the present disclosure. As shown in FIG. 2, the shift register unit 200 includes an adjustment circuit 210, an input circuit 220, an output circuit 230, and a control circuit.

The adjustment circuit 210 includes a first transistor M1. A gate of the first transistor M1 and a first electrode of the first transistor M1 are coupled to an input signal terminal IN, and a second electrode of the first transistor M1 is coupled to an input node P.

The input circuit 220 includes a second transistor M2 and a third transistor M3. A gate of the second transistor M2 and a gate of the third transistor M3 are coupled to an input signal terminal IN, a first electrode of the second transistor M2 is coupled to the input node P, a second electrode of the second transistor M2 is coupled to a first electrode of the third transistor M3, and a second electrode of the third transistor M3 is coupled to a pull-up node PU. The input circuit 220 may be designed into other structures as required. For example, the input circuit 220 may be designed to include a transistor M2, thereby obtaining a simpler input circuit structure. In this case, the gate of the second transistor M2 is coupled to the input signal terminal IN, the first electrode of the second transistor M2 is coupled to the input node P, and the second electrode of the second transistor M2 is coupled to the pull-up node PU.

In some embodiments, the shift register unit 200 may further include a voltage stabilizing circuit 250. As shown in FIG. 2, the voltage stabilizing circuit 250 is coupled to a first power signal terminal VDD1, the pull-up node PU, and a voltage stabilizing node OFF. The voltage stabilizing circuit 250 may provide a voltage at the first power signal terminal VDD1 to the voltage stabilizing node OFF under control of a voltage at the pull-up node PU. In FIG. 2, the voltage stabilizing circuit 250 includes a fourth transistor M4. A gate of the fourth transistor M4 is coupled to the pull-up node PU, a first electrode of the fourth transistor M4 is coupled to the first power signal terminal VDD1, and a second electrode of the fourth transistor M4 is coupled to the voltage stabilizing node OFF. Since the voltage stabilizing circuit 250 may provide a stable voltage (for example, a voltage of the first power signal terminal VDD1 is provided at the second electrode of the fourth transistor M4), so that a voltage stabilizing node OFF may be provided in the shift register unit 200. The voltage stabilizing node OFF may be realized by, for example, the second electrode of the fourth transistor M4, or a node coupled to the second electrode of the fourth transistor M4 may be separately provided in the shift register unit as the voltage stabilizing node. Other circuits or components that need to use the above-mentioned stable voltage may be coupled to the voltage stabilizing node OFF to improve the stability of potentials of the corresponding nodes in the shift register unit. For example, in FIG. 2, the second electrode of the second transistor M2 and the first electrode of the third transistor M3 may be coupled to the voltage stabilizing node OFF. When the pull-up node PU is at a high level and the input signal terminal IN is at a low level, the third transistor M3 is turned off, the fourth transistor M4 is turned on, and a high level at the first power signal terminal VDD1 is provided to the voltage stabilizing node OFF. At this time, since the first electrode of the second transistor M2 and the second electrode of the third transistor M2 are both at a high level, it may avoid leakage current at the pull-up node PU due to an excessive potential difference between the first electrode of the third transistor M3 and the second electrode of the third transistor M3 when the third transistor M3 is in an off state. Other circuits or components in the shift register unit 200 may also be coupled to the voltage stabilizing node OFF to stabilize voltages at the corresponding nodes. For example, transistors M11, M12, M16, M17, M18, and M19 in FIG. 2 is coupled to the voltage stabilizing node OFF in a similar manner to avoid the leakage current at the pull-up node PU, which will be described in further detail below.

The output circuit 230 may include a control output sub-circuit for providing a control output signal and a first output sub-circuit for providing a first output signal. In FIG. 2, the control output sub-circuit includes a twentieth transistor M20 and a capacitor C2 (a second capacitor), and the first output sub-circuit includes a twenty-first transistor M21. A gate of the twentieth transistor M20 is coupled to the pull-up node PU, a first electrode of the twentieth transistor M20 is coupled to a first clock signal terminal CLKD for providing a first clock signal, and a second electrode of the twentieth transistor M20 is coupled to a control output signal terminal CR to output a control output signal at the control output signal terminal CR. A first electrode of the capacitor C2 is coupled to the gate of the twentieth transistor M20, and a second electrode of the capacitor C2 is coupled to the second electrode of the twentieth transistor M20. A gate of the twenty-first transistor M21 is coupled to the pull-up node PU, a first electrode of the twenty-first transistor M21 is coupled to a second clock signal terminal CLKE for providing a second clock signal, and a second electrode of the twenty-first transistor M21 is coupled to a first output signal terminal OUT1 to output a first output signal at the first output signal terminal OUT1.

The control circuit may include a pull-down control sub-circuit 2401 and a pull-down sub-circuit 2402. The pull-down control sub-circuit 2401 is coupled to the pull-up node PU, the pull-down node PD, and a second power signal terminal VDD2. The pull-down control sub-circuit 2401 may control a potential at the pull-down node PD under control of a potential at the pull-up node PU and a potential at the second power signal terminal VDD2. The pull-down sub-circuit 2402 is coupled to output signal terminals (for example, including the control output signal terminal CR and the first output signal terminal OUT1) and the pull-down node PD. The pull-down sub-circuit 2402 may control a potential at the output signal terminals under control of a potential at the pull-down node PD.

In FIG. 2, the pull-down control sub-circuit 2401 includes a tenth transistor M10, an eleventh transistor M11, a twelfth transistor M12, and a thirteenth transistor M13. A gate of the tenth transistor M10 is coupled to the pull-up node PU, a first electrode of the tenth transistor M10 is coupled to a reference signal terminal VGL1 (a first reference signal terminal), and a second electrode of the tenth transistor M10 is coupled to the pull-down node PD. A gate of the eleventh transistor M11 is coupled to the pull-down node PD, a first electrode of the eleventh transistor M11 is coupled to the voltage stabilizing node OFF, and a second electrode of the eleventh transistor M11 is coupled to the pull-up node PU. A gate of the twelfth transistor M12 is coupled to the pull-down node PD, a first electrode of the twelfth transistor M12 is coupled to the reference signal terminal VGL1, and a second electrode of the twelfth transistor M12 is coupled to the voltage stabilizing node OFF. A gate and a first electrode of the thirteenth transistor M13 are coupled to the second power signal terminal VDD2, and a second electrode of the thirteenth transistor M13 is coupled to the pull-down node PD.

In FIG. 2, the pull-down sub-circuit 2402 may include a fourteenth transistor M14 and a fifteenth transistor M15. A gate of the fourteenth transistor M14 is coupled to the pull-down node PD, a first electrode of the fourteenth transistor M14 is coupled to the reference signal terminal VGL1 (the first reference signal terminal), and a second electrode of the fourteenth transistor M14 is coupled to the control output signal terminal CR. A gate of the fifteenth transistor M15 is coupled to the pull-down node PD, a first electrode of the fifteenth transistor M15 is coupled to a reference signal terminal VGL2 (a second reference signal terminal), and a second electrode of the fifteenth transistor M15 is coupled to the first output signal terminal OUT1. The reference signal terminal VGL1 and the reference signal terminal VGL2 may provide same reference level or different reference levels. For example, the reference signal terminal VGL1 may provide a first reference level, and the reference signal terminal VGL2 may provide a second reference level, where the second reference level may be the same as or different from the first reference level. The fourteenth transistor M14 may pull down the control output signal terminal CR to be at the first reference level under control of a potential at the pull-down node PD. The fifteenth transistor M15 may pull down the first output signal terminal OUT1 to be at the second reference level under control of a potential at the pull-down node PD.

In some embodiments, the shift register unit 200 may further include a sensing circuit 260. As shown in FIG. 2, the sensing circuit 260 is coupled to a first control signal terminal Ctr1, a second control signal terminal Ctr2, the input signal terminal IN, and the pull-up node PU. The sensing circuit 260 may store a voltage under control of a potential at the first control signal terminal Ctr1 and a potential at the input signal terminal IN, and use the stored voltage to input a potential at the second control signal terminal Ctr2 to the pull-up node PU. In FIG. 2, the sensing circuit includes a fifth transistor M5, a sixth transistor M6, a seventh transistor M7, and a capacitor C1 (a first capacitor). A gate of the fifth transistor M5 is coupled to the first control signal terminal Ctr1, a first electrode of the fifth transistor M5 is coupled to the input signal terminal IN, and a second electrode of the fifth transistor M5 and a gate of the sixth transistor M6 are coupled to a node H. A first electrode of the sixth transistor M6 is coupled to the second control signal terminal Ctr2, and a second electrode of the sixth transistor M6 and a first electrode of the seventh transistor M7 are coupled to a node N. A gate of the seventh transistor M7 is coupled to the second control signal terminal Ctr2, and a second electrode of the seventh transistor M7 is coupled to the pull-up node PU. A first electrode of the capacitor C1 is coupled to the gate of the sixth transistor M6 (i.e., the node H), and a second electrode of the capacitor C1 is coupled to the second electrode of the sixth transistor M6 (i.e., the node N).

In some embodiments, the shift register unit 200 may further include a reset circuit 270. The reset circuit 270 is coupled to the pull-up node PU and reset signal terminals. The reset circuit 270 may reset the pull-up node PU under control of a potential at the reset signal terminals. For example, the reset circuit 270 includes a first reset sub-circuit for resetting the pull-up node PU under control of a first reset signal terminal RST1. In FIG. 2, the first reset sub-circuit includes a sixteenth transistor M16 and a seventeenth transistor M17. In some embodiments, the reset circuit 270 may further include a second reset sub-circuit for resetting the pull-up node PU under control of a second reset signal terminal RST2. In FIG. 2, the second reset sub-circuit includes an eighteenth transistor M18 and a nineteenth transistor M19. The first reset signal terminal RST1 may provide a first reset signal for resetting the shift register unit 200 itself, and the second reset signal terminal RST2 may provide a second reset signal for resetting all shift register units in the gate driving circuit, which is also called a total reset signal.

As shown in FIG. 2, a gate of the seventeenth transistor M17 is coupled to the first reset signal terminal RST1, a first electrode of the seventeenth transistor M17 is coupled to the voltage stabilizing node OFF, and a second electrode of the seventeenth transistor M17 is coupled to the pull-up node PU. A gate of the sixteenth transistor M16 is coupled to the first reset signal terminal RST1, a first electrode of the sixteenth transistor M16 is coupled to the reference signal terminal VGL1, and a second electrode of the sixteenth transistor M16 is coupled to the voltage stabilizing node OFF. A gate of the eighteenth transistor M18 is coupled to the second reset signal terminal RST2, a first electrode of the eighteenth transistor M18 is coupled to the voltage stabilizing node OFF, and a second electrode of the eighteenth transistor M18 is coupled to the pull-up node PU. A gate of the nineteenth transistor M19 is coupled to the second reset signal terminal RST2, a first electrode of the nineteenth transistor M19 is coupled to the reference signal terminal VGL1, and a second electrode of the nineteenth transistor M19 is coupled to the voltage stabilizing node OFF.

Although two power signal terminals VDD1 and VDD2 are used in the above embodiments, the embodiments of the present disclosure are not limited to this. The first power signal terminal VDD1 and the second power signal terminal VDD2 may be implemented by the same power signal terminal. They may also be implemented as different power signal terminals, as long as the first power signal terminal VDD1 may control the voltage stabilizing node OFF at a desired high level.

When the input signal terminal IN is at a high level, the first transistor M1, the second transistor M2, and the third transistor M3 are turned on, thereby providing a high level at the input signal terminal IN to the pull-up node PU to charge the second capacitor C2, the high level at the pull-up node PU turns on the twentieth transistor M20 and the twenty-first transistor M21. After that, the input signal terminal IN changes to be at a low level, the first transistor M1, the second transistor M2, and the third transistor M3 are turned off, but due to an existence of the capacitor C2, the pull-up node PU is still at a high level, causing the twentieth transistor M20 and the twenty-first transistor M21 to be in an on state, so that a clock signal from the first clock signal terminal CLKD may be output at the control output signal terminal CR, and a clock signal from the second clock signal terminal CLKE may be output at the first output signal terminal OUT1.

When the reset signal terminal (for example, the first reset signal terminal RST1) is at a high level, the seventeenth transistor M17 and the sixteenth transistor M16 are turned on, thereby resetting the pull-up node PU to be at a low level. The low level at the pull-up node PU turns off the tenth transistor M10. At this time, since the thirteenth transistor M3 is in an on state, the high level at the second power signal terminal VDD2 is input to the pull-down node PD. The high level at the pull-down node PD turns on the fourteenth transistor M14 and the fifteenth transistor M15, thereby pulling down the control output signal terminal CR and the first output signal terminal OUT1 to be at a low level, respectively. The high level at the pull-down node PD also turns on the eleventh transistor M11 and the twelfth transistor M12, so that the pull-up node PU remains at a low level.

During a period when the pull-up node PU is at a high level, the fourth transistor M4 in the voltage stabilizing circuit 250 is turned on, thereby providing a high level (for example, a voltage Voff) at the first power signal terminal VDD1 to the voltage stabilizing node OFF. A transistor coupled to the pull-up node PU may be grounded through the voltage stabilizing node OFF instead of directly grounding. For example, the second electrode of the third transistor M3 is coupled to the voltage stabilizing node OFF instead of directly coupled to the reference signal terminal VGL1. When the pull-up node PU is at a high level and the third transistor M3 is turned off, since the voltage stabilizing node OFF is at a high level, it may be possible to avoid generating a leakage current flowing through the third transistor M3 due to the excessive voltage difference between the first electrode of the third transistor M3 and the second electrode of the third transistor M3, thereby preventing the potential at the pull-up node PU from being unstable due to the generation of the leakage current. The eleventh transistor M11, the seventeenth transistor M17, and the eighteenth transistor M18 are also coupled to the voltage stabilizing node in a similar manner, thereby preventing the pull-up node PU from leaking due to the transistors coupled to it.

In FIG. 2, if there is no first transistor M1, the node P (the first electrode of the second transistor M2 in FIG. 2) of the input circuit 220 for receiving the input signal may be directly coupled to the input signal terminal IN. Then a following situation may occur. When the input signal terminal IN is at a low level and the voltage stabilizing node OFF is at a high level, the second transistor M2 is in an off state. At this time, the first electrode of the second transistor M2 is at a low level, and the second electrode of the second transistor M2 is at a high level, and a larger potential difference between the first electrode of the second transistor M2 and the second electrode of the second transistor M2 may cause a leakage current flowing through the second transistor M2. The leakage current may affect other external circuits coupled to the input signal terminal IN. For example, in display driving applications, the shift register unit 200 may be cascaded with other shift register units to generate multiple stages of output signals. For example, the input signal terminal IN of the shift register unit 200 may be coupled to control output signal terminals of the other shift register units. In this case, the leakage current at the input signal terminal IN of the shift register unit 200 may affect potentials at the control output signal terminals of other shift register units, thereby affecting the overall display. This may be described in further detail below in conjunction with a structure of the gate driving circuit.

In an embodiment of the present disclosure, the adjustment circuit 210 is provided in the shift register unit. When the input signal terminal IN is at a low level, the first transistor M1 in the adjustment circuit 210 is turned off, so that the input signal terminal IN is decoupled from the input node P. At this time, even if the voltage stabilizing node OFF is at a high level, since a potential difference between the first electrode of the first transistor M1 and the second electrode of the first transistor M1 is much smaller than a potential difference between the first electrode of the second transistor M2 and the second electrode of the second transistor M2, the leakage current flowing through the first transistor M1 is so small that it may be ignored, so that the leakage current at the input signal terminal IN may be prevented from affecting other shift register units coupled to it. When the input signal terminal IN is at a high level, since the first transistor M1 is turned on, a signal from the input signal terminal IN may be provided to the input node P, thereby ensuring normal output. Of course, the adjustment circuit 210 of the embodiment of the present disclosure is not limited to be applied to the circuit structure shown in FIG. 2. For example, when the input circuit 220 includes a second transistor M2, the first electrode of the second transistor M2 is coupled to the input node P, and the second electrode of the second transistor M2 is coupled to the pull-up node PU. The adjustment circuit 210 may also avoid generating a leakage current at the input signal terminal IN due to an excessive voltage difference between the first electrode of the second transistor M2 and the second electrode of the second transistor M2.

The embodiment of the present disclosure may realize random sensing control by providing the sensing circuit 260 in the shift register unit. For example, in a display phase, if a high level appears at the input signal terminal IN and at the first control signal terminal Ctr1 at the same time, the fifth transistor M5 is turned on, and the high level at the input signal terminal IN is provided to the node H. After that, the input signal terminal IN and the first control signal terminal Ctr1 both change to be at a low level. Due to the existence of the capacitor C1, the high level is stored at the node H, which means that the shift register unit 200 is selected. In a blanking phase, when the second control signal terminal Ctr2 is at a high level, the high level at the node H turns on the sixth transistor M6, and the high level at the second control signal terminal Ctr2 turns on the seventh transistor M7, so that the high level at the second control signal terminal Ctr2 is provided to the pull-up node PU. The high level at the pull-up node PU turns on the twentieth transistor M20 and the twenty-first transistor M21, so that a clock signal from the clock signal terminal CLKD and a clock signal from the clock signal terminal CLKE may be used to generate output signals as sensing control signals. The sensing control signal enables a pixel unit coupled to the shift register unit 200 on the display panel to turn on, so as to collect sensing data from the pixel unit. In the above process, if the shift register unit 200 is not selected in the display phase, a sensing control signal may not be generated in the blanking phase, so that the pixel unit coupled to the shift register unit 200 is not turned on. In this way, one or more shift register units may be randomly selected from a plurality of shift register units to turn on the corresponding pixel units on the display panel for sensing data collection, thereby realizing random sensing.

Figure 3:
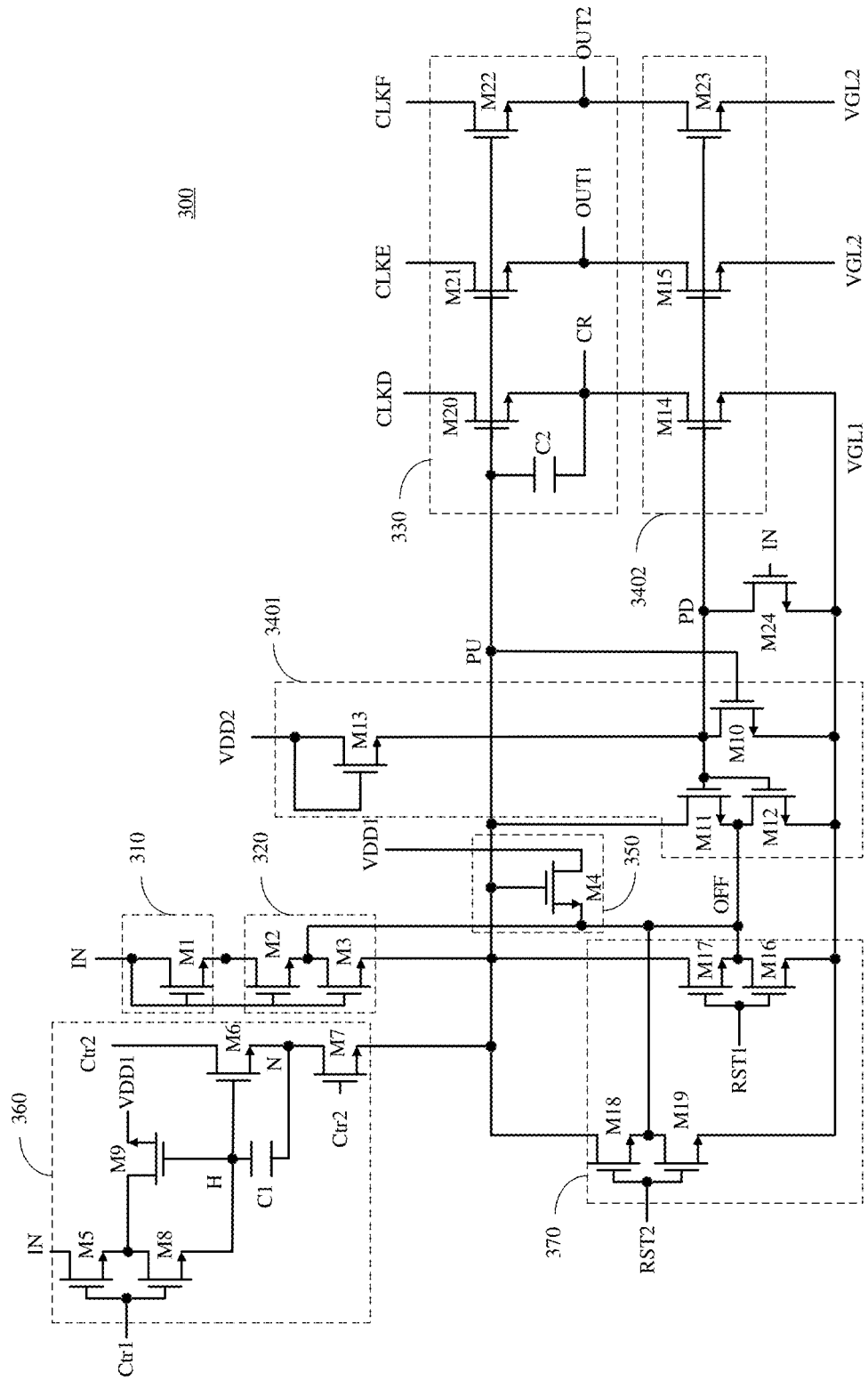
FIG. 3 shows a circuit diagram of a shift register unit according to another embodiment of the present disclosure.

FIG. 3 shows a circuit diagram of a shift register unit 300 according to an embodiment of the present disclosure. The shift register unit 300 in FIG. 3 is similar to the shift register unit 200 in FIG. 2, and the difference lies at least in a sensing circuit 360, an output circuit 330 and a pull-down sub-circuit 3402. For the sake of brevity, the following may mainly describe the different parts in detail.

As shown in FIG. 3, the shift register unit 300 includes an adjustment circuit 310, an input circuit 320, an output circuit 330, a control circuit, a voltage stabilizing circuit 350, a sensing circuit 360, and a reset circuit 370. The control circuit includes a pull-down control sub-circuit 3401 and a pull-down sub-circuit 3402. As shown in FIG. 3, the adjustment circuit 310, the input circuit 320, the voltage stabilizing circuit 350, and the reset circuit 360 may be implemented in a same manner as the adjustment circuit 210, the input circuit 220, the voltage stabilizing circuit 250, and the reset circuit 270, respectively. This may not be repeated here.

The sensing circuit 360 is different from the sensing circuit 260 described above at least in that the sensing circuit 360 further includes an eighth transistor M8 and a ninth transistor M9. As shown in FIG. 3, the fifth transistor M5 and the eighth transistor M8 are coupled in series between the input signal terminal IN and the node H, so that the second electrode of the fifth transistor M5 is coupled to the node H via the eighth transistor M8. The gate of the fifth transistor M5 and a gate of the eighth transistor M8 are both coupled to the first control signal terminal Ctr1, the first electrode of the fifth transistor M5 is coupled to the input signal terminal IN, and the second electrode of the fifth transistor M5 is coupled to the first electrode of the eighth transistor M8, and the second electrode of the eighth transistor M8 are coupled to the node H. A gate of the ninth transistor M9 is coupled to the node H, a first electrode of the ninth transistor M9 is coupled to the first power signal terminal VDD1, and a second electrode of the ninth transistor M9 is coupled to the second electrode of the fifth transistor M5. This makes that when the node H is at a high level and the first control signal terminal Ctr1 is at a low level, the fifth transistor M5 and the eighth transistor M8 are in an off state, and the high level at the node H causes the ninth transistor M9 to be turned on. A high level at the power signal terminal VDD1 is provided to the first electrode of the eighth transistor M8, thereby preventing leakage current at the node H due to an excessive voltage difference between the first electrode of the eighth transistor M8 and the second electrode of the eighth transistor M8.

The difference between the output circuit 330 and the output circuit 230 described above is at least that the output circuit 330 further includes a second output sub-circuit for providing a second output signal at a second output signal terminal OUT2. As shown in FIG. 3, the second output sub-circuit includes a twenty-second transistor M22, a gate of the twenty-second transistor M22 is coupled to the pull-up node PU, a first electrode of the twenty-second transistor M22 is coupled to a third clock signal terminal CLKF, and a second electrode of the twenty-second transistor M22 is coupled to the second output signal terminal OUT2. Correspondingly, a pull-down sub-circuit 3402 further includes a twenty-third transistor M23 for pulling down the second output signal terminal OUT2, a gate of the twenty-third transistor M23 is coupled to the pull-down node PD, and a first electrode of the twenty-third transistor M23 is coupled to the second reference signal terminal VGL2, a second electrode of the twenty-third transistor M23 is coupled to the second output signal terminal OUT2.

In FIG. 3, the shift register unit 300 may further include a twenty-fourth transistor M24. A gate of the twenty-fourth transistor M24 is coupled to the input signal terminal IN, a first electrode of the twenty-fourth transistor M24 is coupled to the first reference signal terminal VGL1, and a second electrode of the twenty-fourth transistor M24 is coupled to the pull-down node PD. The twenty-fourth transistor M24 may further stabilize a potential at the pull-down node PD. For example, when the input signal terminal IN is at a high level, the twenty-fourth transistor M24 is turned on, thereby stabilizing the pull-down node PD at a low level.

Figure 4:
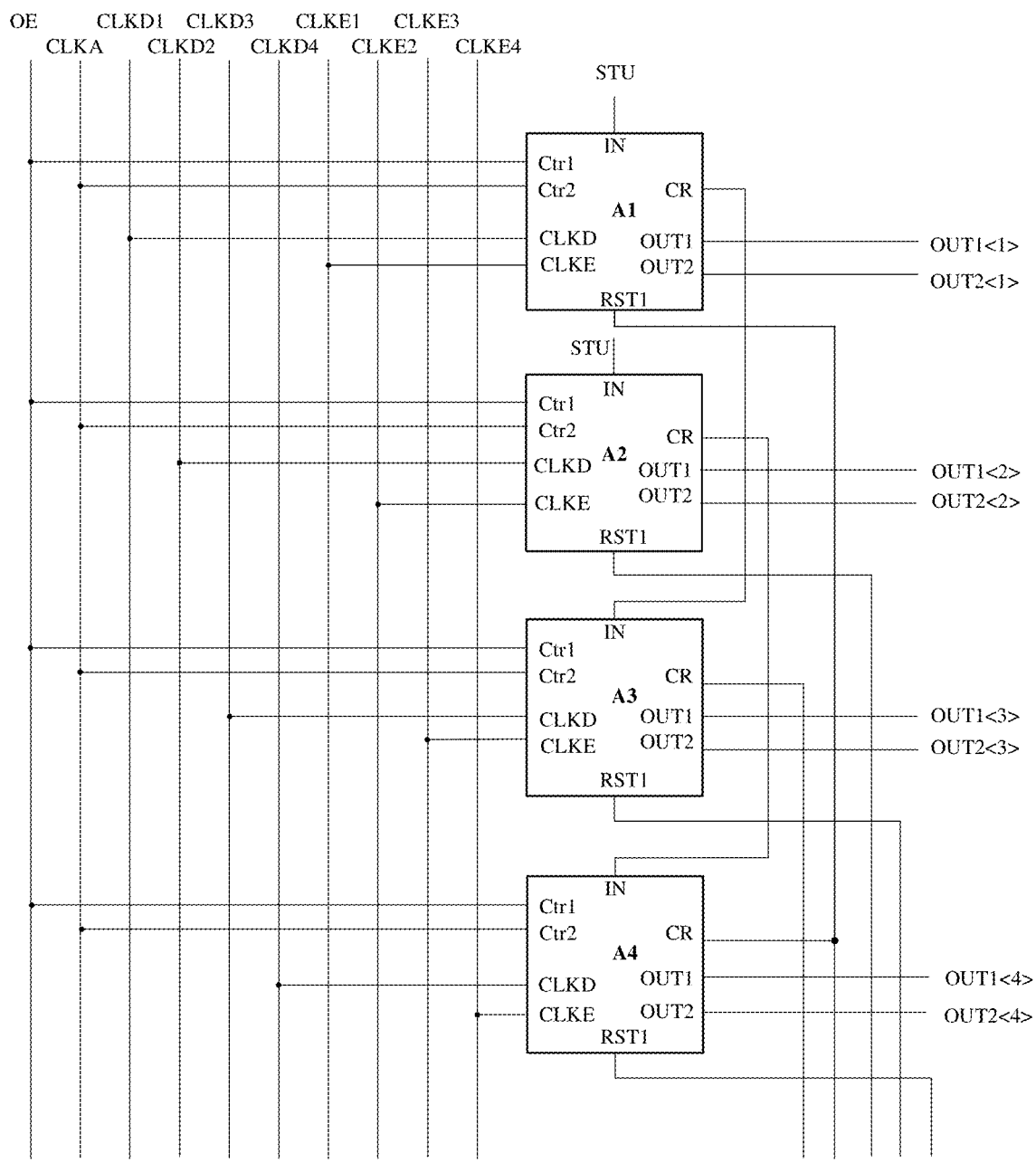
FIG. 4 shows a schematic diagram of a gate driving circuit according to an embodiment of the present disclosure.

FIG. 4 shows a schematic diagram of a gate driving circuit according to an embodiment of the present disclosure. As shown in FIG. 4, the gate driving circuit includes N stages of cascaded shift register units, and N is an integer greater than 1. For brevity, only the first four stages of shift register units A1, A2, A3, and A4 are shown in FIG. 4. However, those skilled in the art should understand that the number of shift register units in the gate driving circuit of the embodiment of the present disclosure is not limited to this, and may be changed as required. Each shift register unit in the gate driving circuit may be implemented by the shift register unit of any of the above-mentioned embodiments, such as any one of the above-mentioned shift register units 100, 200, and 300. In the embodiment of FIG. 4, each shift register unit is implemented by the shift register unit 300 described above.

With reference to FIG. 4, an input signal terminal IN of an $n^{th}$ stage of shift register unit is coupled to a control output signal terminal CR of an $(n-2)^{th}$ stage of shift register unit, and a reset signal terminal RST1 of the $n^{th}$ stage of shift register unit is coupled to a first control output signal terminal CR of an $(n+3)^{th}$ stage of shift register unit, a first control signal terminal Ctr1 of the $n^{th}$ stage of shift register unit is coupled to receive a first control signal OE, and a second control signal terminal Ctr2 of the $n^{th}$ stage of shift register unit is coupled to receive a second control signal CLKA. A first output signal terminal OUT1 and a second output signal terminal OUT2 of the $n^{th}$ stage of shift register unit output an $n^{th}$ stage of first output signal OUT1<n> and an $n^{th}$ stage of second output signal OUT2<n>, respectively, where n is an integer, $3 \le n \le N-3$.

In FIG. 4, the shift register units may be divided into multiple groups, and each group includes four cascaded shift register units. The following describes the first four stages of shift register units A1 to A4 as an example. A first clock signal terminal CLKD and a second clock signal terminal CLKE of a first stage of shift register unit A1 are coupled to receive a clock signal CLKD1 and a clock signal CLKE1, respectively. A first clock signal terminal CLKD and a second clock signal terminal CLKE of a second stage of shift register unit A2 is coupled to receive a clock signal CLKD2 and a clock signal CLKE2, respectively. A first clock signal terminal CLKD and a second clock signal terminal CLKE of a third stage of shift register unit A3 are coupled to receive a clock signal CLKD3 and a clock signal CLKE3, respectively. A first clock signal terminal CLKD and a second clock signal terminal CLKE of a fourth stage of shift register unit A4 are coupled to receive a clock signal CLKD4 and a clock signal CLKE4, respectively. Third clock signal terminals CLKF of the shift register units at various stages may be coupled in a manner similar to the second clock signal terminal CLKE according to needs, which may not be repeated here.

The above only gives an example of the gate driving circuit, and the embodiments of the present disclosure are not limited to this. The structure, the number and the cascade mode of the shift register units in the gate driving circuit may be set according to needs. For example, each shift register unit may have more or fewer output signal terminals, and may provide more or less clock signals for the gate driving circuit, and obtain desired output signal waveforms through the corresponding cascade mode. In some embodiments, the gate driving circuit may include shift register units of different structures as required. For example, the odd-numbered shift register units and the even-numbered shift register units may be implemented in different structures. In some embodiments, for example, the odd-numbered shift register unit and the even-numbered shift register unit may be alternately operated by controlling a voltage at the second power signal terminal of the shift register unit.

A method for driving the shift register unit according to an embodiment of the present disclosure may be described below with reference to FIGS. 5 and 6.

Figure 5:
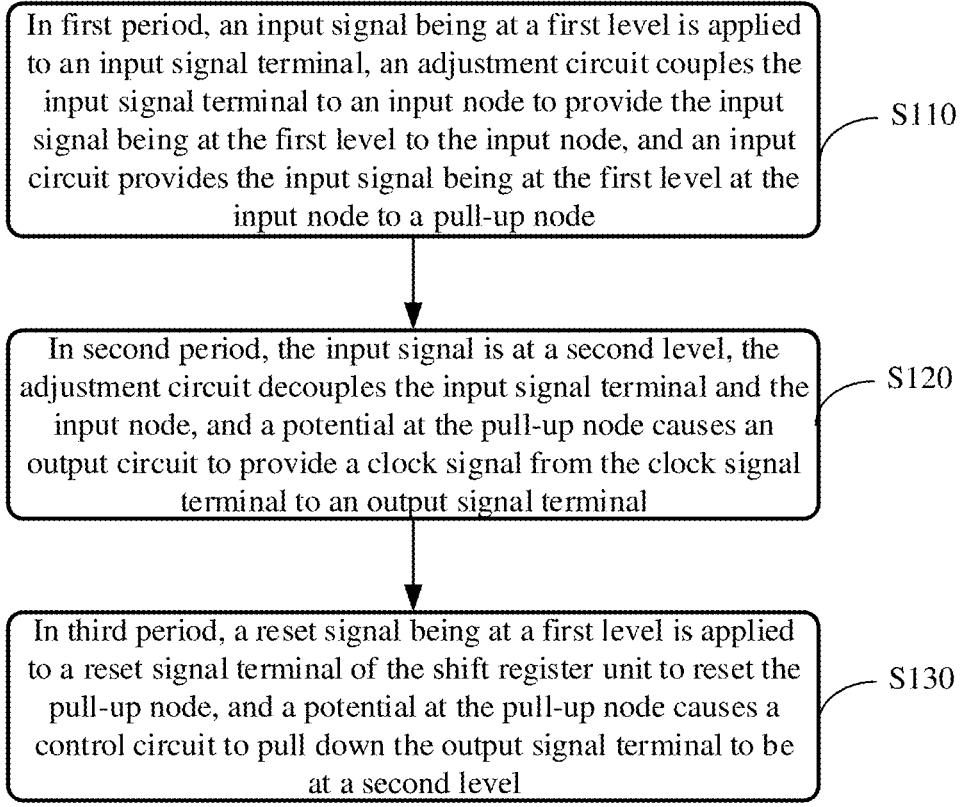
FIG. 5 shows a flowchart of a method for driving a shift register unit according to an embodiment of the present disclosure.

FIG. 5 shows a flowchart of a method for driving the shift register unit according to an embodiment of the present disclosure. This method is applicable to the shift register unit of any of the above embodiments.

In step S110, in a first period, an input signal being at a first level is applied to an input signal terminal, the adjustment circuit couples the input signal terminal to an input node to provide the input signal being at the first level to the input node, and the input circuit provides the input signal being at the first level at the input node to a pull-up node.

In step S120, in a second period, the input signal is at a second level, the adjustment circuit decouples the input signal terminal from the input node, and a potential at the pull-up node causes the output circuit to provide a clock signal from the clock signal terminal to the output signal terminal.

In step S130, in a third period, a reset signal being at a first level is applied to a reset signal terminal of the shift register unit to reset the pull-up node, and a potential at the pull-up node causes the control circuit to pull down the output signal terminal to be at a second level.

Figure 6:
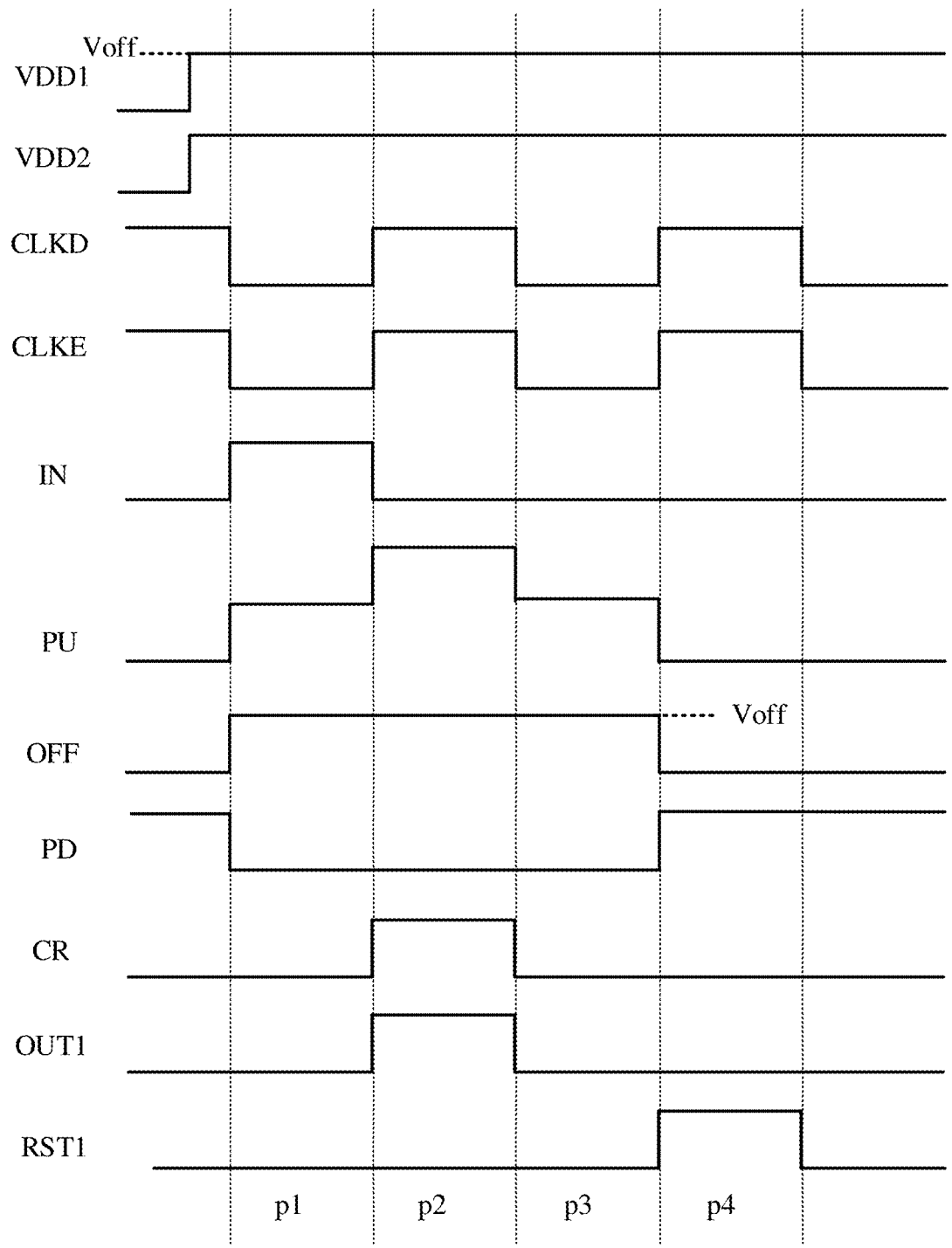
FIG. 6 shows an operation timing diagram of a shift register unit according to an embodiment of the present disclosure.

FIG. 6 shows an operation timing diagram of the shift register unit according to an embodiment of the present disclosure. This driving method is applicable to the shift register unit of any of the above embodiments, and may be described below in conjunction with the structure of the shift register unit 200 in FIG. 2.

In period p1, the input signal terminal IN is at a high level, the first transistor M1, the second transistor M2, and the third transistor M3 are turned on, so that the high level at the input signal terminal IN is input to the pull-up node PU, and the capacitor C2 starts to charge. The high level at the pull-up node PU turns on both the twentieth transistor M20 and the twenty-first transistor M21. At this time, since the first clock signal terminal CLKD and the second clock signal terminal CLKE are both at a low level, the control output signal terminal CR and the first output signal terminal OUT1 are also both at a low level.

In period p2, the input signal terminal IN is at a low level, and the first clock signal terminal CLKD and the second clock signal terminal CLKE are at a high level. At this time, the existence of the capacitor C2 causes the pull-up node PU still to be at a high level, so that the twentieth transistor M20 and the twenty-first transistor M21 are still in an on state. The conduction of the twentieth transistor M20 and the twenty-first transistor M21 causes the control output signal terminal CR and the first output signal terminal OUT1 both to be at a high level. Due to a bootstrap effect of the capacitor C2, a potential at the pull-up node PU is further pulled up.

In period p3, the first clock signal terminal CLKD and the second clock signal terminal CLKE are at a low level. At this time, the existence of the capacitor C2 causes the pull-up node PU still to be at a high level. The twentieth transistor M20 and the twenty-first transistor M21 is still in an on state, so that the control output signal terminal CR and the first output signal terminal OUT1 are also both at a low level.

In period p4, the first reset signal terminal RST1 is at a high level, the thirteenth transistor M13 and the sixteenth transistor M16 are turned on, so that the pull-up node PU is reset to be at a low level (i.e., a potential at the first reference signal terminal VGL1). The low level at the pull-up node PU turns off the tenth transistor M10. At this time, since the thirteenth transistor M13 is in an on state, a high level at the second power signal terminal VDD2 is provided to the pull-down node PD. The high level at the pull-down node PD causes both the fourteenth transistor M14 and the fifteenth transistor M15 to be turned on, thereby pulling down the control output signal terminal CR and the first output signal terminal OUT1 to be at a low level, respectively.

In above processes, when the pull-up node PU is at a high level, the fourth transistor M4 is turned on, thereby providing a high level (for example, a voltage Voff) at the first power signal terminal VDD1 to the voltage stabilizing node OFF. The magnitude of the voltage Voff may be selected according to needs, so that the potential at the voltage stabilizing node OFF may be controlled within a desired range. As analyzed above, the voltage Voff at the voltage stabilizing node OFF causes the other transistors coupled to it not to generate leakage current due to excessive voltage differences between the first electrodes of the other transistors and the second electrodes of the other transistors during a period when the pull-up node PU is at a high level, so as to avoid leakage current at the pull-up node PU.

During the above described period p2 and period p3 (i.e., the above described second period), the input signal terminal IN is at a low level and the voltage stabilizing node OFF is at a high level, so that the second transistor M2 is turned off and the second electrode of the second transistor is at a high level. At this time, if there is no first transistor M1, the first electrode of the second transistor M2 may be directly coupled to the input signal terminal, which may cause the first electrode of the second transistor M2 to be at a low level and the second electrode of the second transistor M2 to be at a high level. A potential difference between the first electrode of the second transistor M2 and the second electrode of the second transistor M2 may cause a leakage current to flow through the second transistor M2. With the first transistor M1, the leakage current problem may be solved. Specifically, the first transistor M1 is turned off when the input signal terminal IN is at a low level, so that even if the voltage stabilizing node OFF is at a high level, a potential difference between the first electrode of the first transistor M1 and the second electrode of the first transistor M1 is also much smaller than the potential difference between the first electrode of the second transistor M2 and the second electrode of the second transistor M2, so as to avoid leakage current at the input signal terminal IN. During the period p1, the first transistor M1 is turned on, so that the input signal terminal IN may be coupled to the input node P to ensure a normal operation of the shift register unit.

Figure 7:
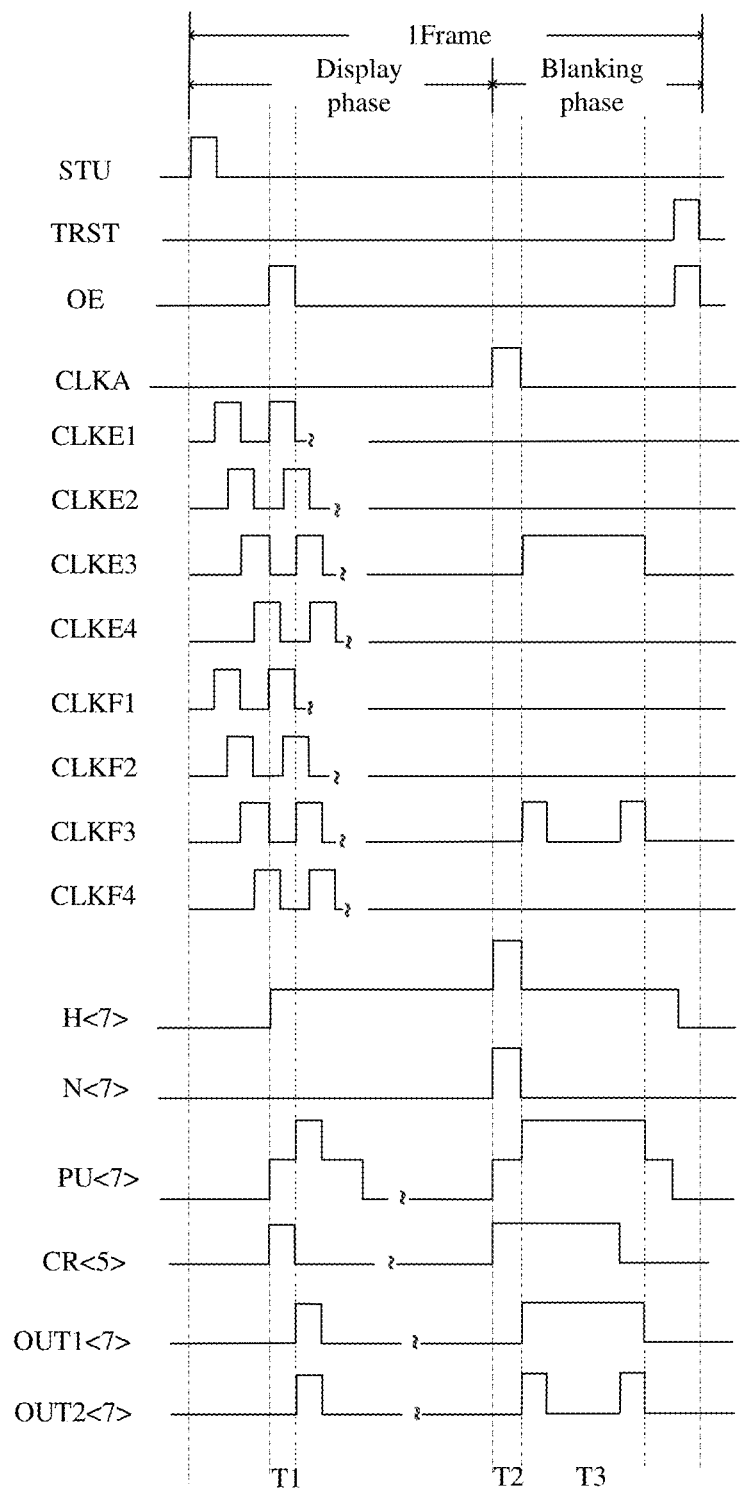
FIG. 7 shows an operation timing diagram of a gate driving circuit according to an embodiment of the present disclosure.

FIG. 7 shows an operation timing diagram of the gate driving circuit according to an embodiment of the present disclosure. The following describes the structure of the gate driving circuit in FIG. 4 and the structure of the shift register unit in FIG. 3. For ease of understanding, FIG. 7 mainly uses a $7^{th}$ stage of shift register unit as an example to illustrate the operation timing of the gate driving circuit of the embodiment of the present disclosure. Those skilled in the art should understand that the operation timing is also applicable to other shift register units.

As shown in FIG. 7, a frame includes a display phase and a blanking phase.

In the display phase, the shift register units at various stages generate output signals according to input signals and clock signals thereof to drive the pixel units on the display panel for display. For example, in an example of FIG. 7, the $7^{th}$ stage of shift register unit generates a first output signal OUT1<7> and a second output signal OUT2<7> according to the received clock signal CLKE3 and the received clock signal CLKF3, and the $8^{th}$ stage of shift register unit generates a first output signal OUT1<8> and a second output signal OUT2<8> according to the received clock signal CLKE4 and the received clock signal CLKF4, and so on. During period T1 of the display phase, since a first control signal OE and an input signal CR<5> of the $7^{th}$ stage of shift register unit are both at a high level, the fifth transistor M5 and the eighth transistor M8 as shown in FIG. 3 are turned on, and the high level at the input signal terminal IN is provided to the node H. Due to the existence of the capacitor C1, the voltage at the node H is stored, as shown by H<7> in FIG. 7. For other shift register units, such as a $6^{th}$ stage of shift register unit, a first control signal OE and an input signal of the $6^{th}$ stage of shift register unit are not at a high level at the same time, so that the node H does not store a high-level voltage.

In the blanking phase, the shift register unit (i.e., the selected shift register unit) storing the voltage at the node H generates a sensing control signal, while other shift register units do not generate sensing control signals. For example, in the example of FIG. 7, during period T2 of the blanking phase, a second control signal CLKA is at a high level. For the selected $7^{th}$ stage of shift register unit, since the node H of the $7^{th}$ stage of shift register unit is at a high level, the sixth transistor M6 is turned on, so that a high level at the second control signal terminal Ctr2 (i.e., the high level of the second control signal CLKA) is provided to the node N. Due to the bootstrap effect of the capacitor C2, the potential at the node H is further pulled up. The high level at the second control signal terminal Ctr2 also turns on the seventh transistor M7, thereby providing the high level of the second control signal CLKA to the pull-up node PU. During period T3 of the blanking phase, for the 7$^{th}$ stage of shift register unit, since a potential at a pull-up node PU<7> is high, the transistor M20, the transistor M21, and the transistor M22 are all turned on, so as to generate the first output signal OUT1<7> based on the clock signal CLKE3 and generate the second output signal OUT2<7> based on the clock signal CLKF3, as the sensing control signals. For other shift register units, such as the 6$^{th}$ stage of shift register unit, since the node H of the 6$^{th}$ stage of shift register unit does not store a high-level voltage, when the second control signal CLKA is at a high level during the period T2, the transistor M6 of the 6$^{th}$ stage of shift register unit is in an off state, so the output signal of the 6$^{th}$ stage of shift register unit is still at a low level. The clock signals CLKD1 to CLKD4 may be set to have the same waveforms as the clock signals CLKE1 to CLKE4 in the display phase, and are in a low level in the blanking phase, so that the control output signal terminals of the shift register units at various stages do not generate control output signals.

In this way, a random selection of the shift register unit in the gate driving circuit is realized. For example, in this embodiment, the 7$^{th}$ stage of shift register unit is selected as the shift register unit to generate the sensing control signal, and other unselected shift register units do not generate sensing control signals.

A noise suppression effect according to an embodiment of the present disclosure may be explained below with reference to FIGS. 8A and 8B.

Figure 8A:
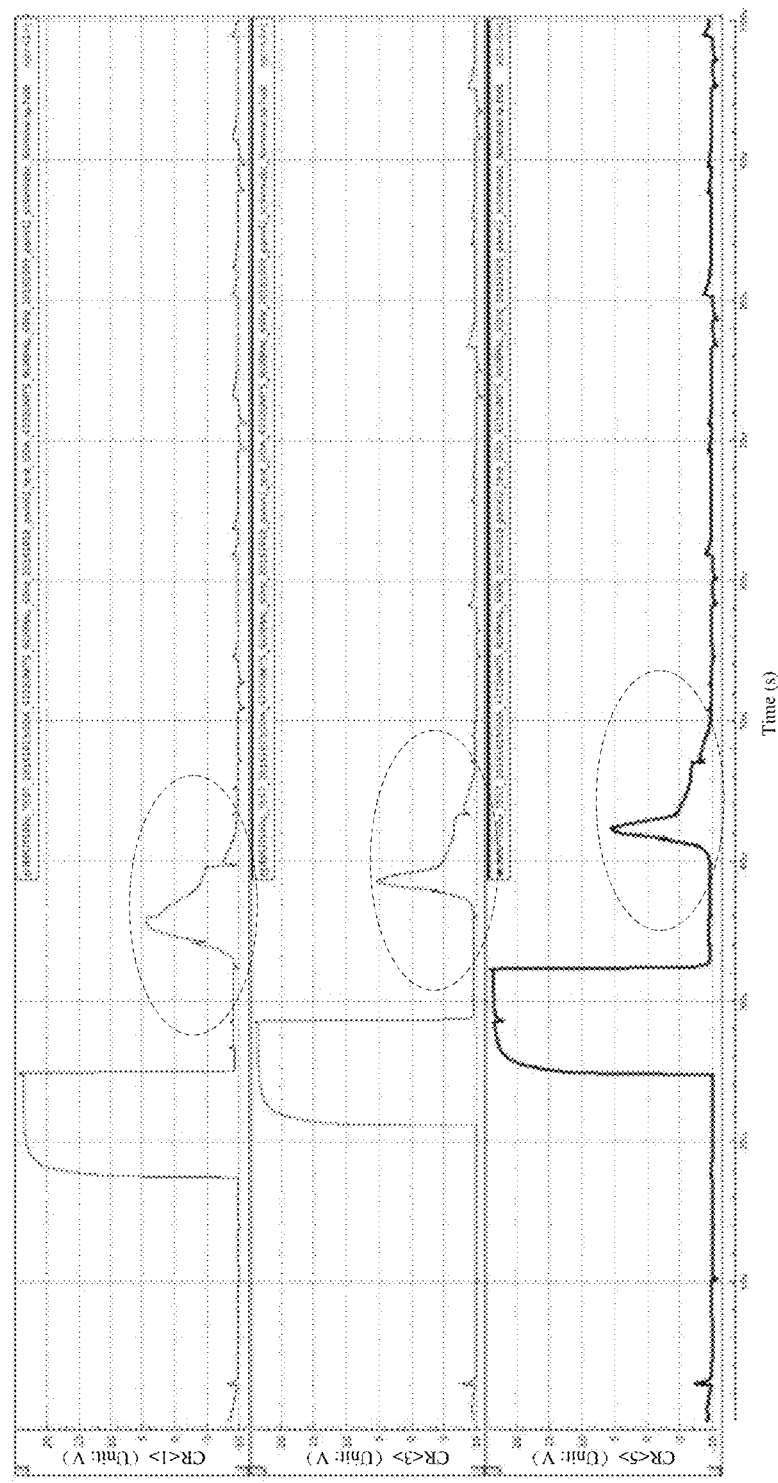
FIG. 8A shows waveforms of the output signals of the shift register units in the gate driving circuit according to an embodiment of the present disclosure without an adjustment circuit.

FIG. 8A shows waveforms of the output signals of the shift register units in the gate driving circuit according to an embodiment of the present disclosure without an adjustment circuit. In this embodiment, the gate driving circuit described with reference to FIG. 4 is taken as an example for description. For ease of description, FIG. 8A shows a waveform of a control output signal CR<1> of the first stage of shift register unit, a waveform of a control output signal CR<3> of the third stage of shift register unit, and a waveform of a control output signal CR<5> of the fifth stage of shift register unit in a case that a threshold voltage at the second transistor M2 is −2.5V, where the abscissa indicates a time, and the ordinate indicates a voltage. It should be clear to those skilled in the art that the embodiments of the present disclosure are not limited to this, and the gate driving circuit may have other structures and corresponding output signal waveforms as required.

In operation processes of the gate driving circuit, taking the fifth stage of shift register unit and the seventh stage of shift register unit as examples, the input signal terminal IN of the seventh stage of shift register unit couples to the control output signal terminal CR of the fifth stage of shift register unit, which causes the input signal terminal IN of the seventh stage of shift register unit to be at a low level and the pull-up node PU<7> of the seventh stage of shift register unit to be at a high level. As analyzed above, if there is no adjustment circuit, the input signal terminal IN of the seventh stage of shift register unit may generate a leakage current, which may affect a potential at the control output signal terminal CR of the fifth stage of shift register unit. Assuming that the fifth stage of shift register unit adopts the circuit structure shown in FIG. 3, after the control output signal terminal CR of the fifth stage of shift register unit changes to be at a low level, during the period when the pull-up node PU is at a high level, the twentieth transistor M20 is turned on, so that the leakage current may be released through the twentieth transistor M20, and no burr may be generated at the control output signal terminal CR; while the pull-up node PU is at a low level, the pull-down node PD is at a high level, which causes the twentieth transistor M20 to be turned off, and the fourteenth transistor M14 to be turned on. As an aspect ratio of the fourteenth transistor M14 is generally smaller than that of the twentieth transistor M20, and a voltage value when the pull-down node PD is at a high level is smaller than a voltage value when the pull-up node PU is at a high level, the leakage current at the control output signal terminal CR is unable to be released through the fourteenth transistor M14, and thus the leakage current at the input signal terminal of the seventh stage of shift register unit may be accumulated at the control output signal terminal CR of the fifth stage of shift register unit, so that noise appears in the control output signal CR<5>, as shown by the dashed box in FIG. 8A. The same situation exists for other stages of shift register units. For example, the control output signal CR<1> of the first stage of shift register unit and the control output signal CR<3> of the third stage of shift register unit may also have noise caused by leakage current, as shown by the dashed box in FIG. 8A.

Figure 8B:
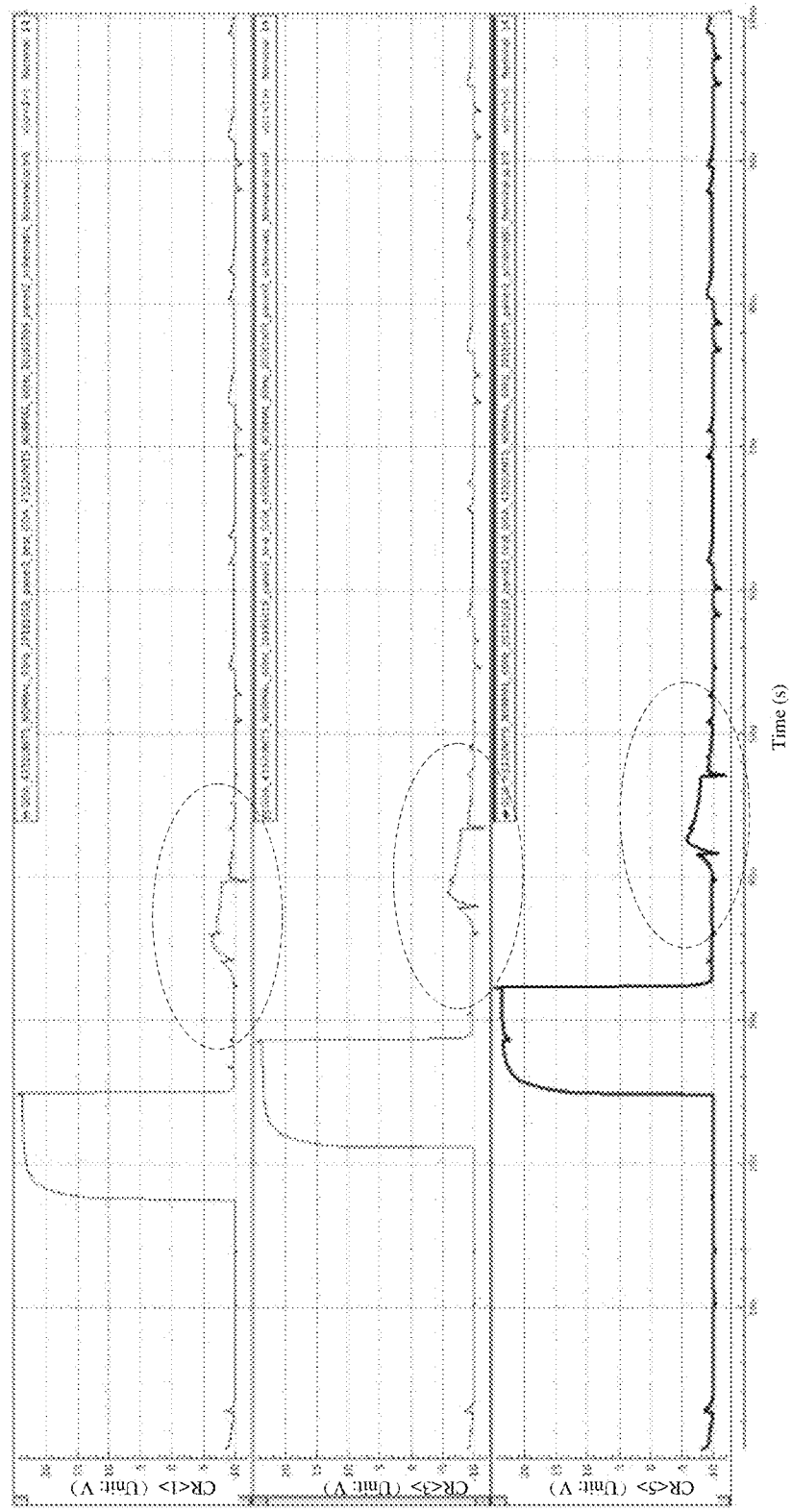
FIG. 8B shows waveforms of the output signals of the shift register units in the gate driving circuit according to an embodiment of the present disclosure with the adjustment circuit.

FIG. 8B shows waveforms of the output signals of the shift register units in the gate driving circuit according to an embodiment of the present disclosure with the adjustment circuit. For comparison, FIG. 8B shows the waveforms of the output signals of the shift register units under the same structures and parameters of the gate driving circuit as in that of FIG. 8A. As shown in FIG. 8B, the fifth stage of shift register unit and the seventh stage of shift register unit are also taken as examples. Since the adjustment circuit is used in the seventh stage of shift register unit, as analyzed above, the leakage current may not be generated at the input signal terminal of the seventh stage of shift register unit or the generated leakage current is within a tolerable range, so that no noise may be generated at the control output signal terminal of the fifth stage of shift register unit, as shown by the dashed box in FIG. 8B. Similarly, the noise caused by the leakage current at the output signal terminals of other stages of the shift register units may also be reduced or eliminated. For example, by comparing FIG. 8A and FIG. 8B, it may be seen that by using the adjustment circuit, the noise caused by the leakage current in the control output signal CR<1> of the first stage of shift register unit, the control output signal CR<3> of the third stage of shift register unit, and the control output signal CR<5> of the fifth stage of shift register unit is significantly reduced or even eliminated.

Those skilled in the art may understand that the embodiments described above are all exemplary, and those skilled in the art may improve them, and the structures described in the various embodiments may be freely combined without conflicting with the structures or principles.

After describing the preferred embodiments of the present disclosure in detail, those skilled in the art may clearly understand that various changes and modifications may be made without departing from the scope and spirit of the appended claims, and the present disclosure is not limited to the implementations of the exemplary embodiments cited in the specification.

What is claimed is:

1. A shift register unit, comprising:
   an adjustment circuit coupled between an input signal terminal and an input node of the shift register unit, and configured to couple or decouple the input signal terminal and the input node under control of a potential at the input signal terminal;
   an input circuit coupled to the input signal terminal, the input node, and a pull-up node of the shift register unit, and configured to provide a potential at the input node to the pull-up node under control of a potential at the input signal terminal;

an output circuit coupled to the pull-up node, a clock signal terminal of the shift register unit, and an output signal terminal of the shift register unit, and configured to receive a clock signal from the clock signal terminal and provide an output signal to the output signal terminal based on the received clock signal under control of a potential at the pull-up node; and a control circuit coupled to the pull-up node and the output signal terminal, and configured to control a potential at the output signal terminal under control of a potential at the pull-up node, wherein the adjustment circuit comprises a first transistor, a gate of the first transistor and a first electrode of the first transistor are coupled to the input signal terminal, and a second electrode of the first transistor is coupled to the input node.

2. The shift register unit according to claim 1, wherein the input circuit comprises a second transistor and a third transistor, a gate of the second transistor and a gate of the third transistor are coupled to the input signal terminal, a first electrode of the second transistor is coupled to the input node, a second electrode of the second transistor is coupled to a first electrode of the third transistor, and a second electrode of the third transistor is coupled to the pull-up node.

3. The shift register unit according to claim 2, further comprising: a voltage stabilizing circuit coupled to a first power signal terminal, the pull-up node, and a voltage stabilizing node, and configured to provide a potential at the first power signal terminal to the voltage stabilizing node under control of a potential at the pull-up node;

wherein the voltage stabilizing node is coupled to the second electrode of the second transistor and the first electrode of the third transistor.

4. The shift register unit according to claim 3, wherein the voltage stabilizing circuit comprises a fourth transistor, a gate of the fourth transistor is coupled to the pull-up node, a first electrode of the fourth transistor is coupled to the first power signal terminal, and a second electrode of the fourth transistor is coupled to the voltage stabilizing node.

5. The shift register unit according to claim 1, further comprising: a sensing circuit coupled to a first control signal terminal, a second control signal terminal, the input signal terminal, and the pull-up node, and configured to store a voltage under control of a potential at the first control signal terminal and a potential at the input signal terminal, and provide a potential at the second control signal terminal to the pull-up node by using the stored voltage.

6. The shift register unit according to claim 5, wherein the sensing circuit comprises a fifth transistor, a sixth transistor, a seventh transistor, and a first capacitor; and wherein a gate of the fifth transistor is coupled to the first control signal terminal, a first electrode of the fifth transistor is coupled to the input signal terminal, and a second electrode of the fifth transistor is coupled to a gate of the sixth transistor;

the gate of the sixth transistor is coupled to the second electrode of the fifth transistor, a first electrode of the sixth transistor is coupled to the second control signal terminal, and a second electrode of the sixth transistor is coupled to a first electrode of the seventh transistor;

a gate of the seventh transistor is coupled to the second control signal terminal, a first electrode of the seventh transistor is coupled to the second electrode of the sixth transistor, and a second electrode of the seventh transistor is coupled to the pull-up node; and a first electrode of the first capacitor is coupled to the gate of the sixth transistor, and a second electrode of the first capacitor is coupled to the second electrode of the sixth transistor.

7. The shift register unit according to claim 6, wherein the sensing circuit further comprises an eighth transistor and a ninth transistor; and wherein a gate of the eighth transistor is coupled to the first control signal terminal, a first electrode of the eighth transistor is coupled to the second electrode of the fifth transistor, and a second electrode of the eighth transistor is coupled to the gate of the sixth transistor; and a gate of the ninth transistor is coupled to the gate of the sixth transistor, a first electrode of the ninth transistor is coupled to a first power signal terminal, and a second electrode of the ninth transistor is coupled to the second electrode of the fifth transistor.

8. The shift register unit according to claim 1, wherein the control circuit comprises:

a pull-down control sub-circuit coupled to the pull-up node, a pull-down node, and a second power signal terminal, and configured to control a potential at the pull-down node under control of a potential at the pull-up node and a potential at the second power signal terminal; and a pull-down sub-circuit coupled to the output signal terminal and the pull-down node, and configured to control a potential at the output signal terminal under control of a potential at the pull-down node.

9. The shift register unit according to claim 8, wherein the pull-down control sub-circuit comprises a tenth transistor, an eleventh transistor, a twelfth transistor, and a thirteenth transistor; and wherein a gate of the tenth transistor is coupled to the pull-up node, a first electrode of the tenth transistor is coupled to a first reference signal terminal, and a second electrode of the tenth transistor is coupled to the pull-down node;

a gate of the eleventh transistor is coupled to the pull-down node, a first electrode of the eleventh transistor is coupled to a voltage stabilizing node, and a second electrode of the eleventh transistor is coupled to the pull-up node;

a gate of the twelfth transistor is coupled to the pull-down node, a first electrode of the twelfth transistor is coupled to the first reference signal terminal, and a second electrode of the twelfth transistor is coupled to the voltage stabilizing node; and a gate of the thirteenth transistor and a first electrode of the thirteenth transistor are coupled to the second power signal terminal, and a second electrode of the thirteenth transistor is coupled to the pull-down node.

10. The shift register unit according to claim 8, wherein the output signal terminal comprises a control output signal terminal and a first output signal terminal, and the pull-down sub-circuit comprises a fourteenth transistor and a fifteenth transistor; and wherein a gate of the fourteenth transistor is coupled to the pull-down node, a first electrode of the fourteenth transistor is coupled to a first reference signal terminal, and a second electrode of the fourteenth transistor is coupled to the control output signal terminal; and a gate of the fifteenth transistor is coupled to the pull-down node, a first electrode of the fifteenth transistor is coupled to a second reference signal terminal, and a second electrode of the fifteenth transistor is coupled to the first output signal terminal.

11. The shift register unit according to claim 1, further comprising a reset circuit, wherein the reset circuit comprises:
a first reset sub-circuit coupled to a first reset signal terminal and the pull-up node, and configured to reset the pull-up node under control of a potential at the first reset signal terminal; and
a second reset sub-circuit coupled to a second reset signal terminal and the pull-up node, and configured to reset the pull-up node under control of a potential at the second reset signal terminal.

12. The shift register unit according to claim 11, wherein:
the first reset sub-circuit comprises a sixteenth transistor and a seventeenth transistor, a gate of the sixteenth transistor is coupled to the first reset signal terminal, a first electrode of the sixteenth transistor is coupled to a first reference signal terminal, and a second electrode of the sixteenth transistor is coupled to a voltage stabilizing node, and a gate of the seventeenth transistor is coupled to the first reset signal terminal, a first electrode of the seventeenth transistor is coupled to the voltage stabilizing node, and a second electrode of the seventeenth transistor is coupled to the pull-up node; and
the second reset sub-circuit comprises an eighteenth transistor and a nineteenth transistor, a gate of the eighteenth transistor is coupled to the second reset signal terminal, a first electrode of the eighteenth transistor is coupled to the voltage stabilizing node, and a second electrode of the eighteenth transistor is coupled to the pull-up node, and a gate of the nineteenth transistor is coupled to the second reset signal terminal, a first electrode of the nineteenth transistor is coupled to the first reference signal terminal, and a second electrode of the nineteenth transistor is coupled to the voltage stabilizing node.

13. The shift register unit according to claim 10, wherein the clock signal terminal comprises a first clock signal terminal and a second clock signal terminal, and the output circuit comprises:
a control output sub-circuit comprising a twentieth transistor and a second capacitor, wherein a gate of the twentieth transistor is coupled to the pull-up node, a first electrode of the twentieth transistor is coupled to the first clock signal terminal, a second electrode of the twentieth transistor is coupled to the control output signal terminal, a first electrode of the second capacitor is coupled to the gate of the twentieth transistor, and a second electrode of the second capacitor is coupled to the second electrode of the twentieth transistor; and
a first output sub-circuit comprising a twenty-first transistor, wherein a gate of the twenty-first transistor is coupled to the pull-up node, a first electrode of the twenty-first transistor is coupled to the second clock signal terminal, and a second electrode of the twenty-first transistor is coupled to the first output signal terminal.

14. The shift register unit according to claim 13, wherein the clock signal terminal further comprises a third clock signal terminal, and the output signal terminal further comprises a second output signal terminal; and
wherein the output circuit further comprises a second output sub-circuit, and the second output sub-circuit comprises a twenty-second transistor, a gate of the twenty-second transistor is coupled to the pull-up node, a first electrode of the twenty-second transistor is coupled to the third clock signal terminal, and a second electrode of the twenty-second transistor is coupled to the second output signal terminal; and
the pull-down sub-circuit further comprises a twenty-third transistor, a gate of the twenty-third transistor is coupled to the pull-down node, a first electrode of the twenty-third transistor is coupled to the second reference signal terminal, and a second electrode of the twenty-third transistor is coupled to the second output signal terminal.

15. The shift register unit according to claim 1, further comprising a twenty-fourth transistor, a gate of the twenty-fourth transistor is coupled to the input signal terminal, a first electrode of the twenty-fourth transistor is coupled to a first reference signal terminal, and a second electrode of the twenty-fourth transistor is coupled to a pull-down node.

16. A gate driving circuit comprising N stages of cascaded shift register units, the shift register units comprising the shift register unit according to claim 1, wherein N is an integer greater than 1.

17. A method for driving the shift register unit according to claim 1, comprising that:
in a first period, an input signal being at a first level is applied to an input signal terminal, an adjustment circuit couples the input signal terminal to an input node to provide the input signal being at the first level to the input node, and an input circuit provides the input signal being at the first level at the input node to a pull-up node;
in a second period, the input signal is at a second level, the adjustment circuit decouples the input signal terminal and the input node, and a potential at the pull-up node causes an output circuit to provide a clock signal from the clock signal terminal to an output signal terminal; and
in a third period, a reset signal being at a first level is applied to a reset signal terminal of the shift register unit to reset the pull-up node, and a potential at the pull-up node causes a control circuit to pull down the output signal terminal to be at a second level.

* * * * *